(12) United States Patent
Kato

(10) Patent No.: US 8,054,654 B2
(45) Date of Patent: Nov. 8, 2011

(54) ELECTRICALLY INSULATED SWITCHING ELEMENT DRIVER AND METHOD FOR CONTROLLING SAME

(75) Inventor: Kozo Kato, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/131,398

(22) PCT Filed: Nov. 27, 2009

(86) PCT No.: PCT/IB2009/007573
§ 371 (c)(1),
(2), (4) Date: May 26, 2011

(87) PCT Pub. No.: WO2010/061281
PCT Pub. Date: Jun. 3, 2010

(65) Prior Publication Data
US 2011/0222316 A1    Sep. 15, 2011

(30) Foreign Application Priority Data

Nov. 27, 2008 (JP) ................. 2008-302464

(51) Int. Cl.
*H02M 3/335* (2006.01)
*H03K 17/56* (2006.01)
(52) U.S. Cl. ........ 363/21.04; 363/71; 363/132; 327/434
(58) Field of Classification Search ............... 363/21.04, 363/21.12, 71, 98, 132; 327/434
See application file for complete search history.

(56) References Cited

U.S. PATENT DOCUMENTS

| 4,455,526 | A |   | 6/1984 | Miller |
| 5,781,040 | A |   | 7/1998 | Myers |
| 5,900,683 | A | * | 5/1999 | Rinehart et al. ............. 307/129 |
| 5,910,746 | A |   | 6/1999 | Fordyce |

(Continued)

FOREIGN PATENT DOCUMENTS

JP    05-064422 A    3/1993
(Continued)

OTHER PUBLICATIONS

International Search Report of PCT/IB2009/007573 issued Feb. 14, 2011 and Written Opinion.

*Primary Examiner* — Adolf Berhane
*Assistant Examiner* — Fred E Finch, III
(74) *Attorney, Agent, or Firm* — Kenyon & Kenyon LLP

(57) ABSTRACT

An electrically insulated switching element driver includes: a pulse transformer driving unit into which a switching element driving signal and a duty signal are input and which drives, in accordance with the duty signal, a first or second pulse transformer that is selected depending on a state of the switching element driving signal; a first edge detection unit that outputs an on-off signal according to an edge in a pre-rectification output of the first pulse transformer; a second edge detection unit that outputs an on-off signal according to an edge in a pre-rectification output of the second pulse transformer; and a control driving unit that drives a switching element to be driven, based on the output of the first and second edge detection units, wherein the first and second edge detection units and the control driving unit operate with power resulting from rectifying the output of the first and second pulse transformers.

4 Claims, 8 Drawing Sheets

U.S. PATENT DOCUMENTS

| | | | |
|---|---|---|---|
| 7,719,305 B2 * | 5/2010 | Chen | 326/21 |
| 2005/0134357 A1 | 6/2005 | Fedigan | |
| 2006/0043389 A1 | 3/2006 | Morikawa | |
| 2008/0219033 A1 * | 9/2008 | Nishikawa | 363/21.16 |

FOREIGN PATENT DOCUMENTS

| | | |
|---|---|---|
| JP | 07-307653 A | 11/1995 |
| JP | 2005-151700 A | 6/2005 |
| JP | 2007-312512 A | 11/2007 |

* cited by examiner

ELECTRICALLY INSULATED SWITCHING ELEMENT DRIVER AND METHOD FOR CONTROLLING SAME

This is a 371 national phase application of PCT/IB2009/007573 filed 27 Nov. 2009, claiming priority to Japanese Patent Application No. 2008-302464 filed 27 Nov. 2008, the contents of which are incorporated herein by reference.

BACKGROUND OF THE INVENTION

1. Field of the Invention

The invention relates to an electrically insulated switching element driver that transmits power and signals from a primary side to a secondary side, via a pulse transformer, and that drives a switching element on the basis of signals transmitted to the secondary side, and relates also to a method for controlling the electrically insulated switching element driver.

2. Description of the Related Art

Japanese Patent Application Publication No. 7-307653 (JP-A-7-307653) discloses a switching element driving circuit provided with a control circuit that generates a control signal made up of pulses whose duty ratio is controlled; a frequency dividing circuit that outputs first and second control signals; a first driving circuit that generates a first driving signal, the first driving circuit being made up of a pulse transformer and a clamp circuit that clamps the back emf voltage generated by the pulse transformer; a second driving circuit that generates a second driving signal, the second driving circuit being made up of a pulse transformer and a clamp circuit that clamps the back emf voltage generated by the pulse transformer; and a synthesizing circuit that generates a driving signal that drives a switching element. In the above switching element driving circuit, the frequency dividing circuit divides the frequency of the control signal and outputs a first control signal in which a high level period and a low level period are arranged, and a second control signal in which a high level period is arranged during the low level period of the first control signal and a low level period is arranged during the high level period of the first control signal. The first driving circuit generates a first driving signal by operating in synchrony with the first control signal, and the second driving circuit generates a second driving signal by operating in synchrony with the second control signal, where a high level period is arranged during the low level period of the first driving signal and a low level period is arranged during the high level period of the first driving signal. The synthesizing circuit generates the above-described driving signal by combining the first driving signal and the second driving signal.

In the above switching element driving circuit, however, a driving signal for driving the switching element is transmitted via a pulse transformer, and is not necessarily be an exact square wave. Therefore, the driving signal may not be transmitted properly.

SUMMARY OF THE INVENTION

The invention provides an electrically insulated switching element driver capable of transmitting a driving signal properly, and a method for controlling the electrically insulated switching element driver.

A first aspect of the invention is an electrically insulated switching element driver that includes: a first pulse transformer; a second pulse transformer; a duty signal generator that generates a duty signal having a predetermined duty ratio; a pulse transformer driving unit into which a switching element driving signal and the duty signal are input and which drives, in accordance with the duty signal, one of the first pulse transformer and the second pulse transformer that is selected depending on a state of the switching element driving signal; a first edge detection unit that outputs an on-off signal according to an edge in a pre-rectification output of the first pulse transformer; a second edge detection unit that outputs an on-off signal according to an edge in a pre-rectification output of the second pulse transformer; and a control driving unit that drives a switching element to be driven, on the basis of the output of the first edge detection unit and the second edge detection unit; wherein the first edge detection unit, the second edge detection unit and the control driving unit operate with power resulting from rectifying the output of the first and second pulse transformers.

The first aspect of the invention, allows reproducing a voltage signal output by a pulse transformer and that is not necessarily an exact square wave, in a state suitable for driving control. This allows transmitting the switching element driving signal properly.

In the first aspect of the invention, the pulse transformer driving unit may include a first switching element that is connected to the first pulse transformer, a second switching element that is connected to the second pulse transformer, and a temporary pulse signal generator, wherein when the duty signal is in a Hi state, the pulse transformer driving unit may turn on a switching element, from among the first switching element and the second switching element, that is connected to a pulse transformer to be driven from among the first pulse transformer and the second pulse transformer, and when the duty signal is in a Low state upon starting to drive the pulse transformer to be driven, the temporary pulse signal generator may output a temporary pulse signal for temporarily turning on the switching element that is connected to the pulse transformer to be driven.

In the first aspect of the invention, also, the control driving unit may lower an impedance between a reference potential point and a driving terminal of the switching element to be driven, after a predetermined lapse of time since the switching element to be driven is turned off.

In the first aspect of the invention, also, the electrically insulated switching element driver may further include an anomaly detection unit that detects an anomaly in the switching element to be driven; and a anomaly transmission unit that outputs a signal that indicates an anomaly detected by the anomaly detection unit, via a pulse transformer not being driven from among the first and second pulse transformers.

A second aspect of the invention is a method for controlling an electrically insulated switching element driver that has a first pulse transformer, a second pulse transformer and a switching element to be driven, the method including: generating a duty signal having a predetermined duty ratio; driving, in accordance with the duty signal, one of the first pulse transformer and the second pulse transformer that is selected depending on the state of a switching element driving signal; outputting a first on-off signal according to an edge in a pre-rectification output of the first pulse transformer; outputting a second on-off signal according to an edge in a pre-rectification output of the second pulse transformer; and driving the switching element to be driven, on the basis of the first on-off signal and the second on-off signal.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

First Embodiment

An electrically insulated switching element driver 1 according to a first embodiment of the invention is explained next. The electrically insulated switching element driver 1 is a device that transmits power and signals from primary side to a secondary side, via a pulse transformer, and that drives a switching element on the secondary side on the basis of transferred signals.

Figure 1:
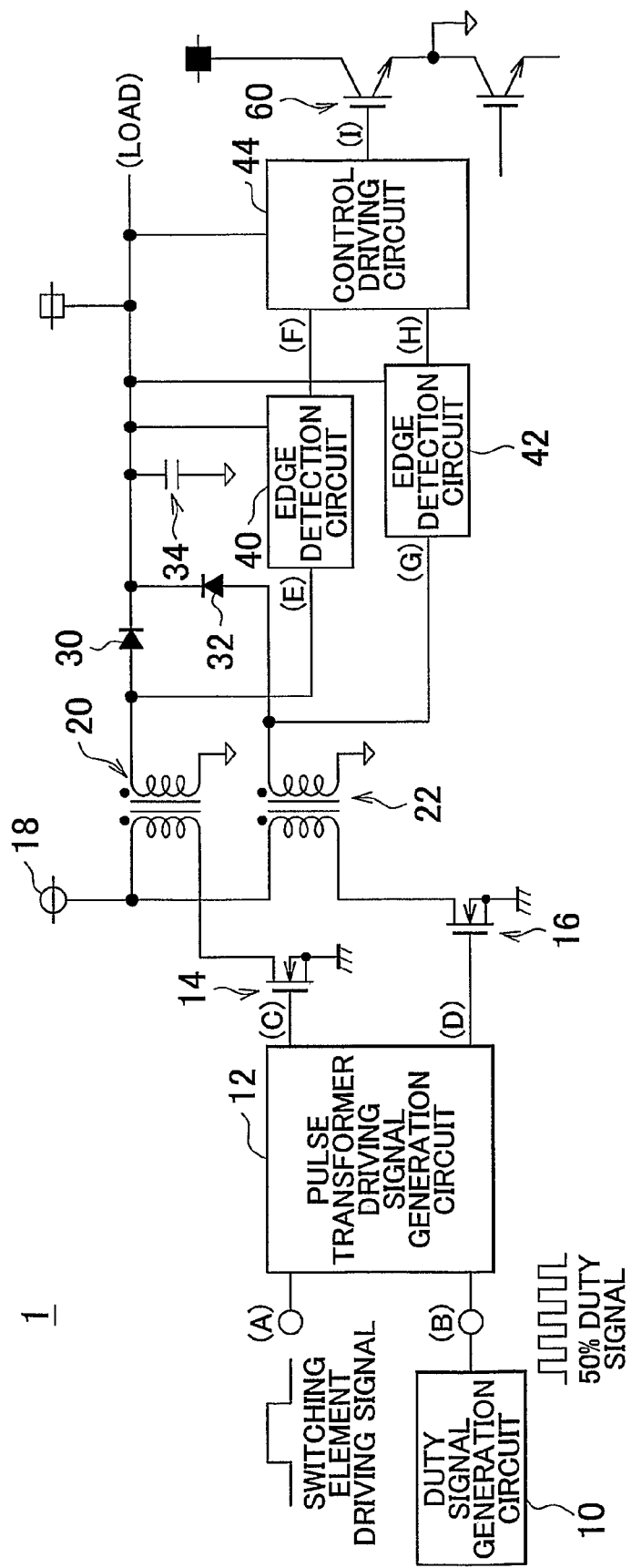
FIG. 1 is a configuration example of an electrically insulated switching element driver 1 according to a first embodiment of the invention.

FIG. 1 is a configuration example of the electrically insulated switching element driver 1 according to the first embodiment of the invention.

(Primary Side)

The electrically insulated switching element driver 1 has a duty signal generation circuit 10, a pulse transformer driving signal generation circuit 12, a first switching element 14, a second switching element 16 and a power source 18, as primary-side constituent elements.

The duty signal generation circuit 10 outputs a voltage signal (duty signal), having for instance a 50% duty ratio, to the pulse transformer driving signal generation circuit 12.

Figure 2:
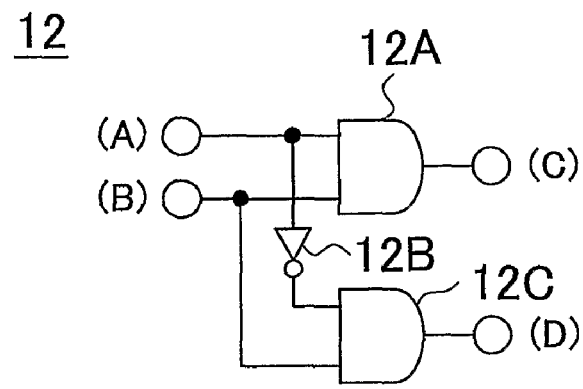
FIG. 2 is a configuration example of a pulse transformer driving signal generation circuit 12 according to the first embodiment of the invention.

Besides the duty signal, the pulse transformer driving signal generation circuit 12 has input thereto a switching element driving signal which is a signal for driving a secondary-side switching element to be driven 60. FIG. 2 is a configuration example of the pulse transformer driving signal generation circuit 12 according to the first embodiment of the invention. The pulse transformer driving signal generation circuit 12 has, for instance, an AND gate 12A to which a switching element driving signal and a duty signal are input; and an AND gate 12C to which a inversion signal of the switching element driving signal, which is inverted by an inverting gate 12B, and the duty signal are input. The output of the AND gate 12A is input to the first switching element 14, and the output of the AND gate 12C is input to the second switching element 16.

Figure 3:
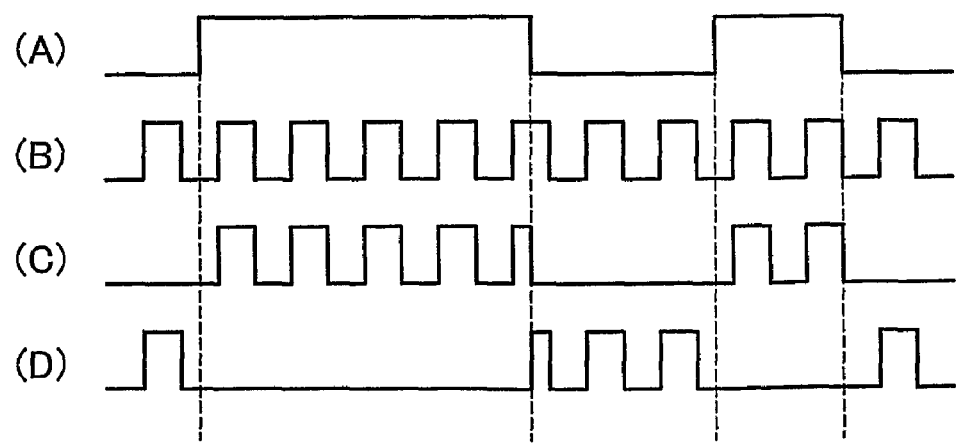
FIG. 3 is a timing chart illustrating changes over time for a switching element driving signal and a duty signal input to the pulse transformer driving signal generation circuit 12, a voltage signal output from the pulse transformer driving signal generation circuit 12 to a first switching element 14, and a voltage signal output from a pulse transformer driving signal generation circuit 12 to a second switching element 16.

FIG. 3 is a timing chart illustrating changes over time for a switching element driving signal ((A) in the figure) and a duty signal ((B) in the figure) inputted to the pulse transformer driving signal generation circuit 12; a voltage signal ((C) in the figure) output from the pulse transformer driving signal generation circuit 12 to the first switching element 14; and a voltage signal ((D) in the figure) output from a pulse transformer driving signal generation circuit 12 to the second switching element 16.

The first switching element 14 and the second switching element 16 are N-channel transistors. Upon being turned on through input of a voltage signal that exceeds a threshold value, the first switching element 14 electrically connects the power source 18 and a primary winding of a first pulse transformer 20. Upon being turned on through input of a voltage signal that exceeds a threshold value, the second switching element 16 electrically connects the power source 18 and a primary winding of a second pulse transformer 22.

The above-described configuration and operation allow suppressing saturation of the pulse transformers, and allow supplying power to secondary side continuously. In addition, no special limitations are imposed on the duty ratio for controlling the switching element to be driven 60 (the duty ratio can range from 0% to 100%). This makes for greater latitude of control. Moreover, The duty signal generation circuit 10 may be a stand-alone circuit, whereby both the scale and current consumption of the device can be reduced. Also, the oscillating frequency is single, which facilitates noise countermeasures.

(Secondary Side)

An explanation follows next on the constituent elements on the secondary side of the electrically insulated switching element driver 1. The electrically insulated switching element driver 1 has, as secondary-side constituent elements, diodes 30, 32, a capacitor 34, a first edge detection circuit 40, a second edge detection circuit 42 and a control driving circuit 44.

The diode 30 and the capacitor 34 rectify the output of the secondary winding of the first pulse transformer 20, and output the rectified output to a load side. The diode 32 and the capacitor 34 rectify the output of the secondary winding of the second pulse transformer 22 and output the rectified output to the load side. The first edge detection circuit 40, the second edge detection circuit 42 and the control driving circuit 44 operate by being supplied with power rectified by the above diodes and capacitor. The pre-rectification output of the secondary winding of the first pulse transformer 20 is input, as a voltage signal, to the first edge detection circuit 40. The pre-rectification output of the secondary winding of the second pulse transformer 22 is input, as a voltage signal, to the second edge detection circuit 42.

Figure 4:
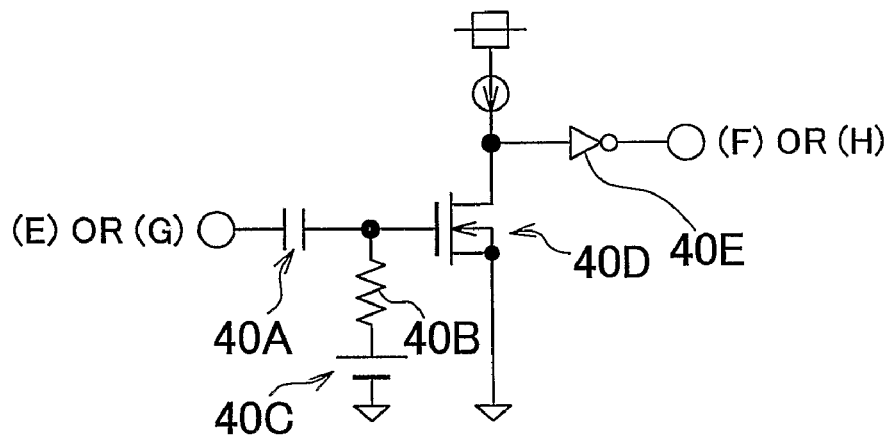
FIG. 4 is a configuration example of a first edge detection circuit 40.

FIG. 4 is a configuration example of the first edge detection circuit 40. The first edge detection circuit 40 has, for instance, a capacitor 40A, a resistor 40B, a reference voltage generator 40C, an N-channel transistor 40D and an inverting gate 40E. The second edge detection circuit 42 may have the same configuration as the first edge detection circuit 40.

The capacitor 40A and the resistor 40B function as high-pass filters. As a result, voltage is applied to the N-channel transistor 40D, for a short time, in accordance with the edge (rising edge and falling edge), of the input voltage signal (high voltage applied for the rising edge and low voltage applied for the falling edge). Voltage of the voltage signal input to the inverting gate 40E is low (referred to hereafter as voltage signal in a Low state) when the N-channel transistor 40D is turned on. Voltage of the voltage signal input to the inverting gate 40E is high (referred to hereafter as voltage signal in a Hi state) when the N-channel transistor 40D is turned off. Therefore, the N-channel transistor 40D is in the on-state only upon rising of the voltage signal input to the first edge detection circuit 40. At that time, the voltage signal input to the inverting gate 40E is in a Low state, while the voltage signal ultimately output is in a Hi state. As a result, the first edge detection circuit 40 outputs a Hi-state voltage signal upon rising of the inputted voltage signal.

Figure 5:
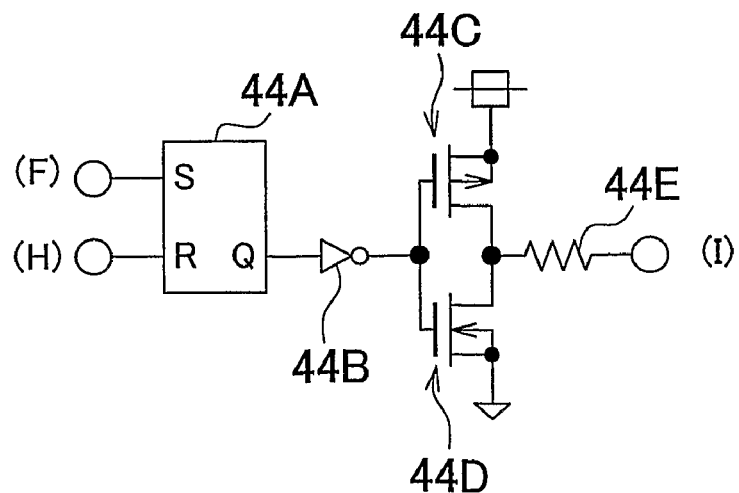
FIG. 5 is a configuration example of a control driving circuit 44.

FIG. 5 is a configuration example of the control driving circuit 44. The control driving circuit 44 has, for instance, a flip-flop 44A, an inverting gate 44B, a P-channel transistor 44C, an N-channel transistor 44D, and a resistor 44E.

The output of the first edge detection circuit 40 is input to an S(Set) terminal of the flip-flop 44A, while the output of the second edge detection circuit 42 is input to an R(Reset) terminal of the flip-flop 44A.

A Hi-state voltage signal is input to the inverting gate 44B over a period of time extending from the timing at which the output of the first edge detection circuit 40 changes to a Hi state, with the output of the second edge detection circuit 42 in a Low state, to the timing at which the output of the second edge detection circuit 42 changes to a Hi state, with the output of the first edge detection circuit 40 in a Low state. At other times, a Low-state voltage signal is input to the inverting gate 44B. The switching element driving signal input to the primary side is reproduced therefore in the signal input to the inverting gate 44B.

A inversion signal of the voltage signal which is inverted by the inverting gate 44B is inverted again by the P-channel transistor 44C and the N-channel transistor 44D, and is applied to the gate of the switching element to be driven 60 via the resistor 44E. As a result, the switching element to be driven 60 is driven on the basis of the switching element driving signal input to the primary side. The switching element to be driven 60 is, for instance, an insulated gate bipolar transistor (IGBT) or a power metal oxide semiconductor field effect transistor (MOSFET).

In the image depicted in FIG. 1, the switching element denoted by the switching element to be driven 60 functions as an inverter using a plurality of sets in parallel, wherein each set is made up of the switching element to be driven 60 and part or the entirety of the electrically insulated switching element driver 1. The switching element is not limited thereto, and may function as a converter, using one set.

The above configuration allows a voltage signal output by a pulse transformer, and that is not necessarily an exact square wave signal, being reproduced in a state suitable for driving control, since the output signal of each edge detection circuit is an on-off signal, i.e. an square wave voltage signal. This allows transmitting the switching element driving signal properly.

The electrically insulated switching element driver 1 of the present embodiment allows transmitting a switching element driving signal properly.

Second Embodiment

An electrically insulated switching element driver according to a second embodiment of the invention is explained next. The electrically insulated switching element driver of the present embodiment is the pulse transformer driving signal generation circuit 12 of the first embodiment having now supplementary features for preventing delay of driving start of the pulse transformer. The explanation below will therefore deal only with the pulse transformer driving signal generation circuit 12.

Figure 6:
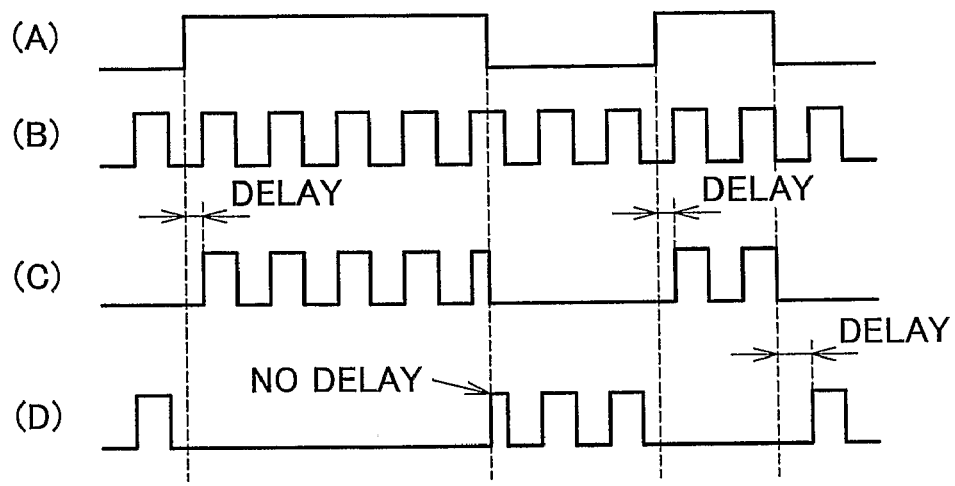
FIG. 6 is an explanatory diagram for explaining a phenomenon wherein driving start of a pulse transformer is delayed by a combination of phases of a switching element driving signal and a duty signal.

Delay of driving start of the pulse transformer will be explained first. In a device such as the one of the first embodiment, driving start of the pulse transformer may be delayed by a combination of a phase of switching element driving signal and a phase of duty signal. FIG. 6 is an explanatory diagram for explaining such a phenomenon. In this phenomenon, when the duty signal is in a Low state upon driving start of either pulse transformer (upon rising or falling of the switching element driving signal), the pulse transformers do not start being driven until the next duty signal which is in the Hi state, as illustrated in the figure. As a result, driving start of the pulse transformers is delayed at most by a half period of the duty signal. The driving start timing of the switching element to be driven 60 is also delayed relative to the switching element driving signal.

Figure 7:
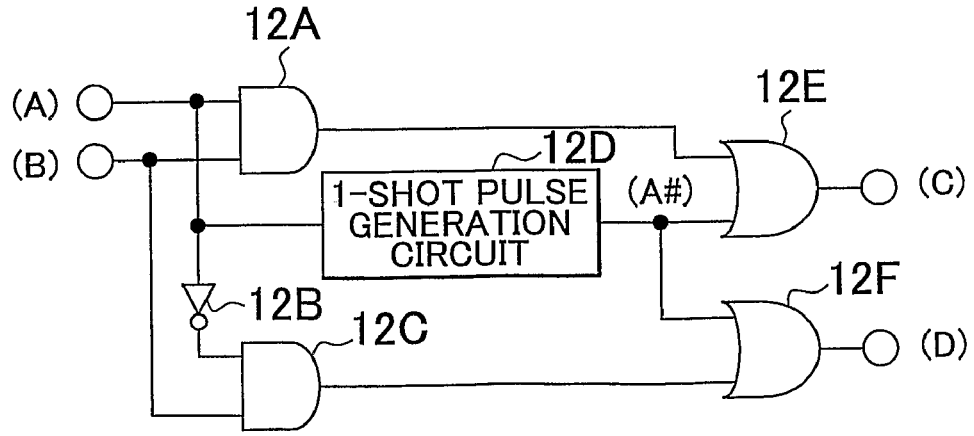
FIG. 7 is a configuration example of a pulse transformer driving signal generation circuit 12 according to a second embodiment of the invention.

FIG. 7 is a configuration example of the pulse transformer driving signal generation circuit 12 according to the second embodiment of the invention, which improves on the above problem. As illustrated in the figure, the pulse transformer driving signal generation circuit 12 according to the second embodiment has an AND gate 12A, an inverting gate 12B and an AND gate 12C, as in the first embodiment, and, in addition, a one-shot pulse generation circuit 12D and OR gates 12E, 12F.

Figure 8:
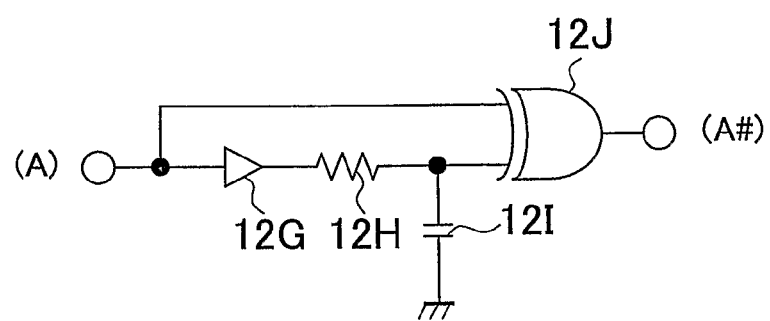
FIG. 8 is a configuration example of a one-shot pulse generation circuit 12D.

FIG. 8 is a configuration example of the one-shot pulse generation circuit 12D. The one-shot pulse generation circuit 12D has a buffer gate 12G, a resistor 12H, a capacitor 12I and an exclusive OR gate 12J.

Voltage transmission by the buffer gate 12G, the resistor 12H, and the capacitor 12I is delayed upon rising and falling of the switching element driving signal input to the one-shot pulse generation circuit 12D. As a result, the two voltage signals input to the exclusive OR gate 12J become temporarily dissimilar. Upon rising and falling of the switching element driving signal, therefore, the one-shot pulse generation circuit 12D outputs a Hi-state voltage signal, for a short time.

Figure 9:
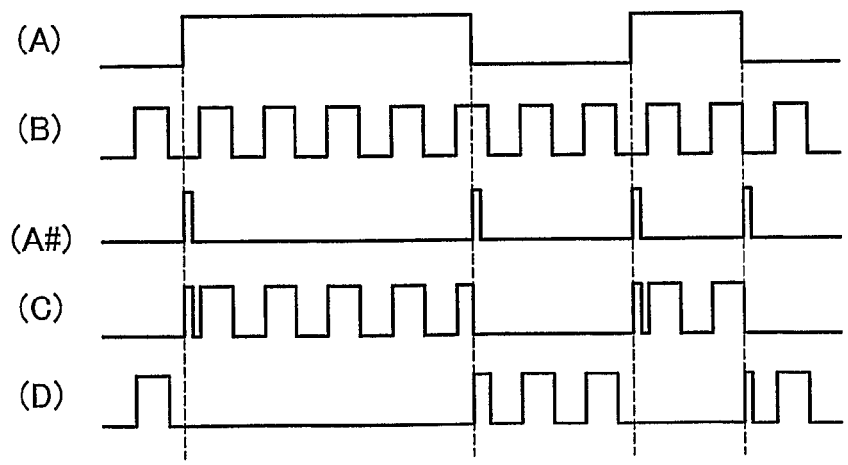
FIG. 9 is a timing chart of the change over time of a switching element driving signal and a duty signal input to the pulse transformer driving signal generation circuit 12, an output signal of the one-shot pulse generation circuit 12D, a voltage signal output from the pulse transformer driving signal generation circuit 12 to the first switching element 14, and a voltage signal output from the pulse transformer driving signal generation circuit 12 to the second switching element 16, in a case where the one-shot pulse generation circuit 12D is added to the pulse transformer driving signal generation circuit 12.

FIG. 9 is a timing chart of the change over time of a switching element driving signal ((A) in the figure) and a duty signal ((B) in the figure) input to the pulse transformer driving signal generation circuit 12; an output signal ((A#) in the figure) of the one-shot pulse generation circuit 12D; a voltage signal ((C) in the figure) output from the pulse transformer driving signal generation circuit 12 to the first switching element 14; and a voltage signal ((D) in the figure) output from the pulse transformer driving signal generation circuit 12 to the second switching element 16, in a case where the one-shot pulse generation circuit 12D is added to the pulse transformer driving signal generation circuit 12. As illustrated in the figure, the output signal of the one-shot pulse generation circuit 12D compensates for the missing output of the pulse transformer driving signal generation circuit 12 at the timing at which driving start of the pulse transformer is delayed in the example of FIG. 6. As a result, the pulse transformers can start being driven more speedily when the switching element driving signal is rising and falling. The switching element to be driven 60 can therefore be controlled with better responsiveness towards changes in the switching element driving signal.

In addition to the effect explained in the first embodiment, the electrically insulated switching element driver of the present embodiment has moreover the effect of preventing driving start delay in the pulse transformers, so that the switching element to be driven 60 can be controlled with better responsiveness towards changes in the switching element driving signal.

When functioning as a converter, the electrically insulated switching element driver of the present embodiment affords, for instance, greater output voltage precision and higher switching frequency, and allows reducing the size and lowering the cost of the switching elements and converter inductors.

Likewise, switching frequency can be increased, for instance, when the electrically insulated switching element driver of the present embodiment functions as an inverter.

Third Embodiment

An electrically insulated switching element driver according to a third embodiment of the invention is explained next. In the electrically insulated switching element driver according to the present embodiment, the control driving circuit 44 of the first embodiment and the second embodiment is replaced by a control driving circuit capable of modifying its own driving impedance. Accordingly, only the control driving circuit 44 will be explained here.

Figure 10:
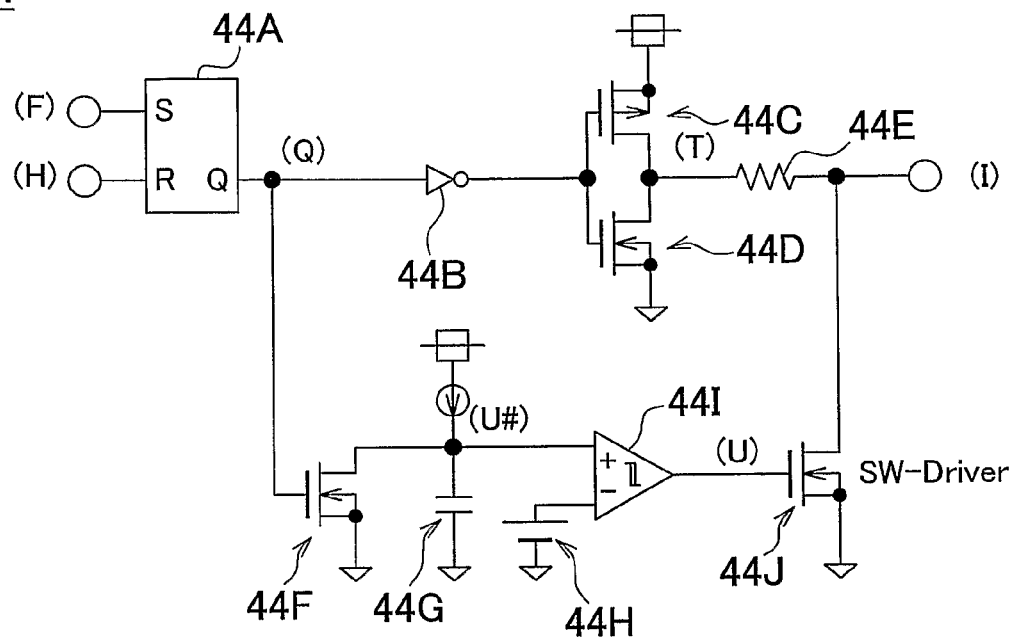
FIG. 10 is a configuration example of the control driving circuit 44 according to a third embodiment of the invention.

FIG. 10 is a configuration example of the control driving circuit 44 according to the third embodiment of the invention. As illustrated in the figure, the control driving circuit 44 according to the third embodiment has a flip-flop 44A, an inverting gate 44B, a P-channel transistor 44C, an N-channel transistor 44D and a resistor 44E, as in the first embodiment and the second embodiment, and, in addition, an N-channel transistor 44F, a capacitor 44G, a reference voltage generator 44H, a comparator 44I and an SW-Driver 44J. The supplementary constituent elements added to those of the first embodiment and the second embodiment are connected to the output terminal of the flip-flop 44A and the output terminal of the control driving circuit 44.

When the output of the flip-flop 44A changes from the Hi state to the Low state, the N-channel transistor 44F is turned off. Thereupon, the potential at point U# in the figure would rise, but does not reach the reference potential of the comparator 44I until a certain charge is stored in the capacitor 44G. The above configuration functions therefore as a timer wherein the SW-Driver 44J is turned on after a predetermined time has lapsed since the output of the flip-flop 44A changes from the Hi state to the Low state.

As a result, the impedance between a ground terminal and the gate terminal of the switching element to be driven 60 decreases after a predetermined time has lapsed since the switching element to be driven 60 is turned off (i.e. since the output of the flip-flop 44A changes from the Hi state to the Low state)

Conversely, when the output of the flip-flop 44A changes from the Low state to the Hi state, the N-channel transistor 44F is turned on, and point U# in the figure shorts with the ground terminal, whereupon the potential at the point U# drops rapidly.

Figure 11:
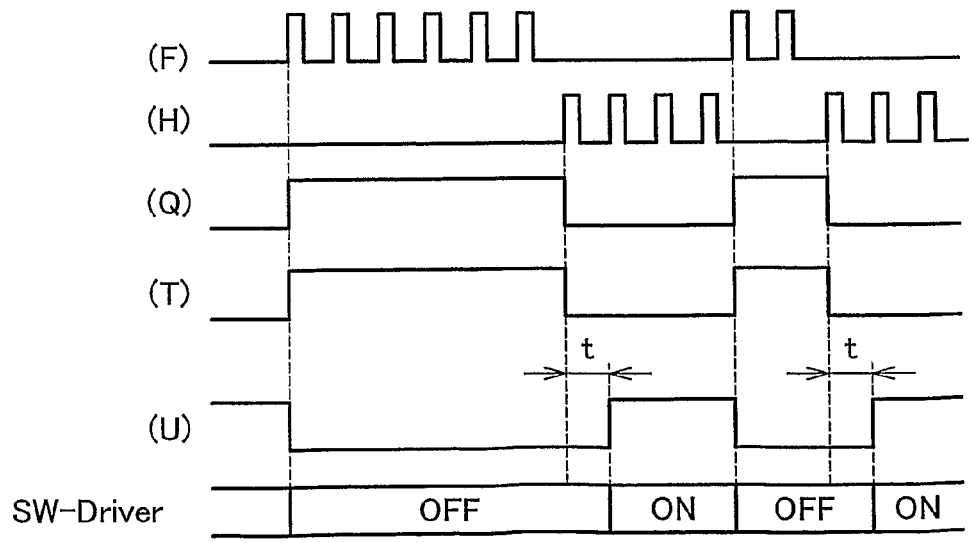
FIG. 11 is a timing chart illustrating the change over time of a signal input to the control driving circuit 44 from the first edge detection circuit 40, a signal input to the control driving circuit 44 from a second edge detection circuit 42, an output signal of a flip-flop 44A, an output signals of a P-channel transistor 44C and an N-channel transistor 44D, an output signal of a comparator 44I, and the change over time of the state of an SW-Driver 44J, in the third embodiment.

FIG. 11 is a timing chart illustrating the change over time of a signal input to the control driving circuit 44 from the first edge detection circuit 40 ((F) in the figure); a signal input to the control driving circuit 44 from the second edge detection circuit 42 ((H) in the figure); the output signal of the flip-flop 44A ((Q) in the figure); the output signals of the P-channel transistor 44C and the N-channel transistor 44D ((T) in the figure); the output signal of the comparator 44I ((U) in the figure); and the change over time of the state of the SW-Driver 44J, in the third embodiment.

Erroneous turn-on of the switching element to be driven 60, caused by the operation of the opposite arm, can be prevented by the above configuration. Specifically, it becomes possible to prevent the switching element to be driven 60 from being turned on through driving of other devices connected in parallel, when using a plurality of sets in parallel where each set is made up of the switching element to be driven 60 and part or the entirety of the electrically insulated switching element driver, according to the present embodiment.

Moreover, the impedance between the ground terminal and the gate terminal of the switching element to be driven 60 decreases after a predetermined time has lapsed since the switching element to be driven 60 is turned off. This allows suppressing problems, such as malfunction of the switching element to be driven 60, caused by abrupt voltage changes.

In addition to the effects explained in the first embodiment and the second embodiment, the electrically insulated switching element driver of the present embodiment allows protecting the switching element to be driven 60 and so forth through avoidance of abrupt voltage changes, and allows preventing erroneous turn-on of the switching element to be driven 60 due to the operation of the opposite arm.

Fourth Embodiment

An electrically insulated switching element driver 4 according to a fourth embodiment of the invention is explained next. The electrically insulated switching element driver 4 of the present embodiment has the features of the first through third embodiments, and is additionally configured so as to detect anomalies in the switching element to be driven 60 and transmit the anomalies to the primary side.

Figure 12:
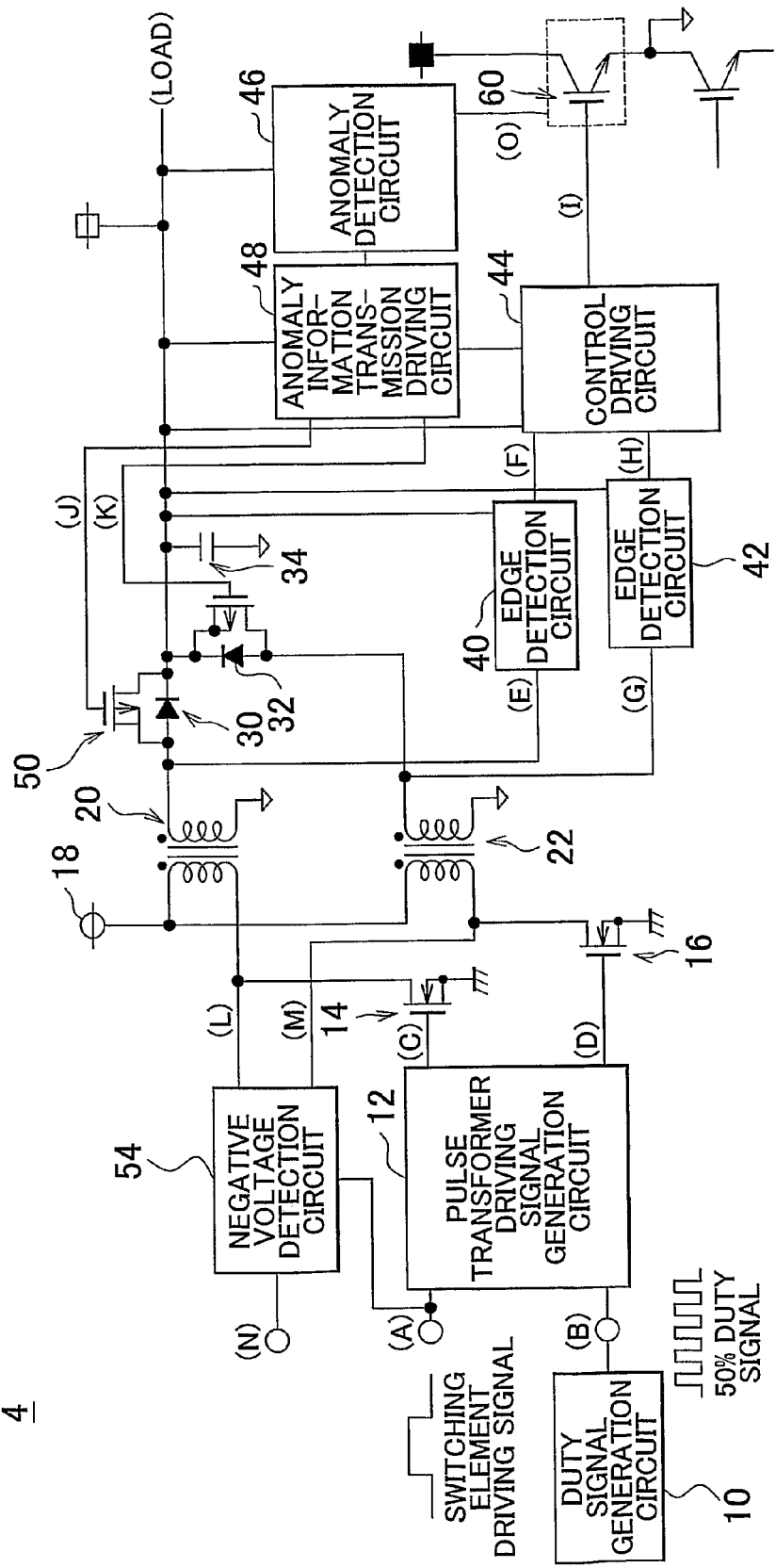
FIG. 12 is a configuration example of an electrically insulated switching element driver 4 according to a fourth embodiment of the invention.

FIG. 12 is a configuration example of the electrically insulated switching element driver 4 according to the fourth embodiment of the invention. In addition to the configuration of the first through third embodiments, the electrically insulated switching element driver 4 has also an anomaly detection circuit 46, an anomaly information transmission driving circuit 48, P-channel transistors 50, 52 respectively shorted with both terminals of diodes 30, 32, and a negative voltage detection circuit 54.

Figure 13:
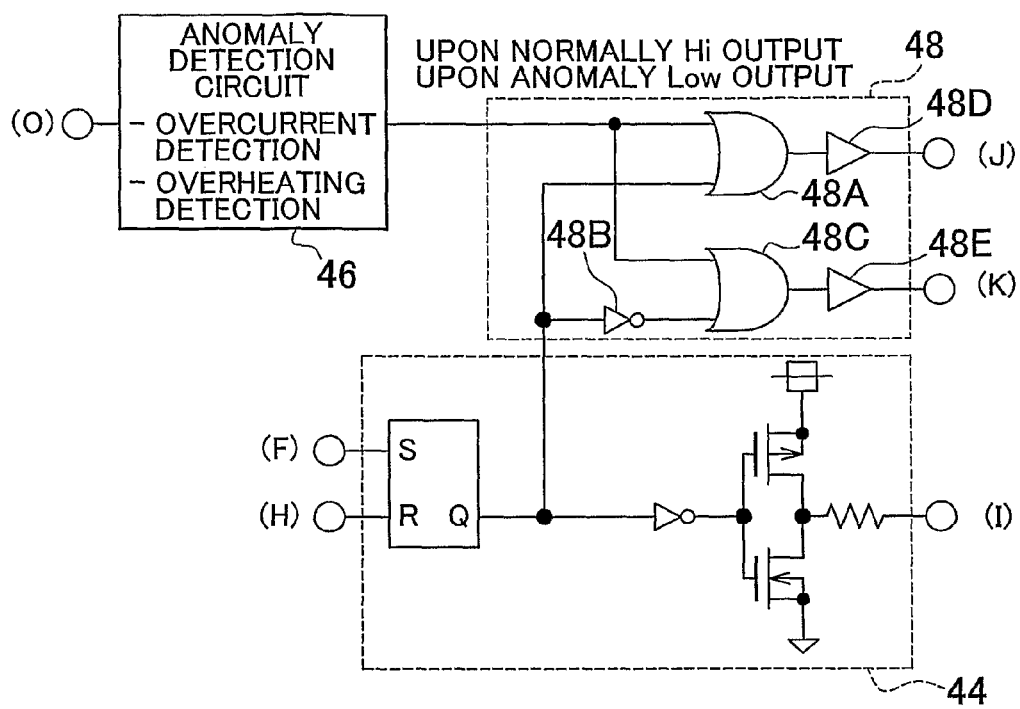
FIG. 13 is a configuration example of the anomaly information transmission driving circuit 48.

FIG. 13 is a configuration example of the anomaly information transmission driving circuit 48. The anomaly detection circuit 46 performs a conventional anomaly detection operation such as overcurrent detection or overheating detection. The anomaly detection circuit 46 outputs a Hi-state voltage signal when the switching element to be driven 60 is in a normal state, and a Low-state voltage signal when the switching element to be driven 60 is in an anomalous state. The anomaly information transmission driving circuit 48 has, for instance, an OR gate 48A to which the output signal of the anomaly detection circuit 46 and the output signal of the flip-flop 44A are input; an OR gate 48C to which the output signal of the anomaly detection circuit 46 and a inversion signal of the output signal of the flip-flop 44A, which is inverted by an inverting gate 48B; are input, and buffer gates 48D, 48E that transmit the output of the OR gates.

When the output signal of the anomaly detection circuit 46 is in a Low state, one of the P-channel transistors 50, 52, which is connected to the pulse transformer not being driven, is turned on. As a result, power supplied from the pulse transformer being driven flows to the ground terminal via the pulse transformer not being driven, while the power whose direction is opposite to a direction during normal driving flows through the primary winding of the pulse transformer not being driven.

As a result, the voltage between the drain and the source of the switching element not being on-off controlled, from among the first switching element 14 and the second switching element 16, becomes negative. The magnitude of this negative voltage is equal to that of the forward voltage Vf (for instance about −0.7 V) of a parasitic diode of the first switching element 14 or the second switching element 16.

Figure 14:
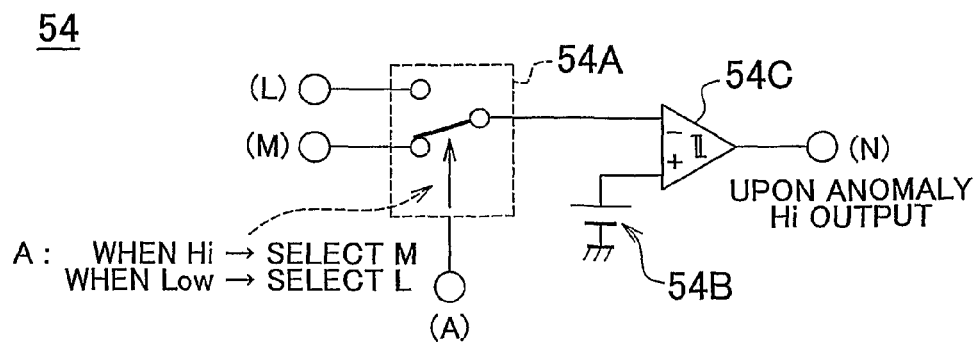
FIG. 14 is a configuration example of a negative voltage detection circuit 54.

The negative voltage thus generated is detected by the negative voltage detection circuit 54. FIG. 14 is a configuration example of the negative voltage detection circuit 54. The negative voltage detection circuit 54 has, for instance, an analog switch 54A, connected to the input terminals of the primary windings of the pulse transformers, and which can select the pulse transformer to electrically connect with based on the switching driving signal, a reference voltage generator 54B and a comparator 54C. In the above configuration, the negative voltage detection circuit 54 outputs a Hi-state voltage signal to the exterior (primary side) when the switching element to be driven 60 is in an anomalous state.

The above configuration allows transmitting anomalies on the secondary side to the primary side, and allows executing rapidly various fail-safe processes. The configuration improves component reliability while containing costs, as compared with providing a means such as a photocoupler.

The electrically insulated switching element driver 4 of the present embodiment allows transmitting anomalies on the secondary side to the primary side.

Examples of preferred embodiments for carrying out the invention have been explained above, but the invention is in no way limited to these examples, and various modifications and substitutions can be made to the examples without departing from the scope of the invention.

The invention can be used, for instance, in the manufacture of automobiles and automotive components.

The invention claimed is:

1. An electrically insulated switching element driver, comprising:
a first pulse transformer;
a second pulse transformer;
a duty signal generator that generates a duty signal having a predetermined duty ratio;
a pulse transformer driving unit into which a switching element driving signal and the duty signal are input, and which, in accordance with the duty signal, drives one of the first pulse transformer and the second pulse transformer that is selected depending on a state of the switching element driving signal; and
a first edge detection unit, a second edge detection unit, and a control driving unit that operate with power resulting from rectifying the output of the first pulse transformer and the second pulse transformer, wherein
the first edge detection unit outputs an on-off signal according to an edge in a pre-rectification output of the first pulse transformer;
the second edge detection unit outputs an on-off signal according to an edge in a pre-rectification output of the second pulse transformer; and
the control driving unit drives a switching element to be driven, on the basis of the output of the first edge detection unit and the second edge detection unit.

2. The electrically insulated switching element driver according to claim 1, wherein
the pulse transformer driving unit is configured to turn on one of a first switching element
and a second switching element that is connected to one of the first pulse transformer and the second pulse transformer when the duty signal is in a Hi state and,
the pulse transformer driving unit includes the temporary pulse signal generator that outputs a temporary pulse signal for temporarily turning on the one of a first switching element and a second switching element when the duty signal is in a Low state upon starting to drive the one of the first pulse transformer and the second pulse transformer.

3. The electrically insulated switching element driver according to claim 1, wherein the control driving unit lowers an impedance between a reference potential point and a driving terminal of the switching element to be driven after a predetermined lapse of time since the switching element to be driven is turned off.

4. The electrically insulated switching element driver according to claim 1, further comprising:
an anomaly detection unit that detects an anomaly in the switching element to be driven; and
an anomaly transmission unit that outputs a signal indicating the anomaly detected by the anomaly detection unit via a pulse transformer that is not being driven, from among the first pulse transformer and the second pulse transformer.

* * * * *